US009363918B2

(12) United States Patent
Santoni et al.

(10) Patent No.: US 9,363,918 B2
(45) Date of Patent: Jun. 7, 2016

(54) CLAMPING ELEMENT

(71) Applicant: ABB Technology AG, Zürich (CH)

(72) Inventors: Fabrizio Santoni, Rome (IT); Matteo Magri, Bergamo (IT)

(73) Assignee: ABB TECHNOLOGY AG, Zürich (CH)

( * ) Notice: Subject to any disclaimer, the term of this patent is extended or adjusted under 35 U.S.C. 154(b) by 184 days.

(21) Appl. No.: 14/166,404

(22) Filed: Jan. 28, 2014

(65) Prior Publication Data

US 2014/0139976 A1    May 22, 2014

Related U.S. Application Data

(63) Continuation of application No. PCT/EP2012/061598, filed on Jun. 18, 2012.

(30) Foreign Application Priority Data

Jul. 28, 2011  (EP) ..................................... 11175805

(51) Int. Cl.
| H02B 1/32 | (2006.01) |
| H05K 7/14 | (2006.01) |
| H02B 1/052 | (2006.01) |
| F16B 1/00 | (2006.01) |

(52) U.S. Cl.
CPC ................ H05K 7/1411 (2013.01); F16B 1/00 (2013.01); H02B 1/052 (2013.01); H02B 1/32 (2013.01); *Y10T 24/44034* (2015.01)

(58) Field of Classification Search
CPC ......... H02B 1/205; H02B 1/044; H02B 1/052
See application file for complete search history.

(56) References Cited

U.S. PATENT DOCUMENTS

| 4,600,174 | A | | 7/1986 | Gosse et al. |
| 5,094,592 | A | * | 3/1992 | Nakajima ............... F04C 28/14 417/295 |
| 5,174,788 | A | | 12/1992 | Herbert |
| 5,529,273 | A | * | 6/1996 | Benthin ................. A47H 1/142 160/902 |

(Continued)

OTHER PUBLICATIONS

International Search Report (PCT/ISA/210) mailed on Sep. 20, 2012, by the European Patent Office as the International Searching Authority for International Application No. PCT/EP2012/061598.

(Continued)

*Primary Examiner* — Gregory Thompson
(74) *Attorney, Agent, or Firm* — Buchanan Ingersoll & Rooney PC

(57) ABSTRACT

A clamping element is configured for mounting a rail element bearing electrical/electronic devices on a supporting portion of a switchgear cabinet. The clamping element includes a body provided with a coupling portion configured for engaging with an opening portion of the rail element. The coupling portion is configured for enabling the body to be at least one of coupled with and removed from the rail element when the body is positioned in a first configuration relative to the rail element. The coupling portion is configured for hindering removal of the body from the rail element when the body is positioned in a second configuration relative to the rail element. The clamping element also includes a clasping device protruding from the body and configured for removably connecting the body to the supporting portion to mount the rail element within the switchgear cabinet.

15 Claims, 6 Drawing Sheets

(56) References Cited

U.S. PATENT DOCUMENTS

| | | | | |
|---|---|---|---|---|
| 5,768,091 | A | * | 6/1998 | Vinson .................. H02B 1/052 200/293 |
| 6,378,825 | B1 | | 4/2002 | Yee et al. |
| 8,226,433 | B1 | * | 7/2012 | Correll ................. H01R 9/2608 439/532 |
| 2008/0299820 | A1 | * | 12/2008 | Schelonka ........... H01R 9/2608 439/532 |
| 2010/0314522 | A1 | * | 12/2010 | Molnar .................. H02B 1/052 248/346.06 |

OTHER PUBLICATIONS

Written Opinion (PCT/ISA/237) mailed on Sep. 20, 2014, by the European Patent Office as the International Searching Authority for International Application No. PCT/EP2012/061598.

* cited by examiner

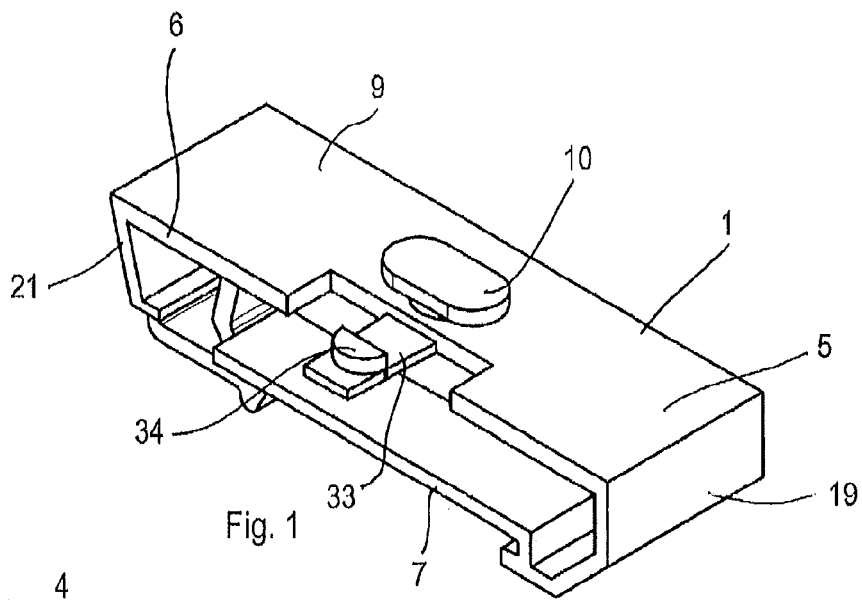
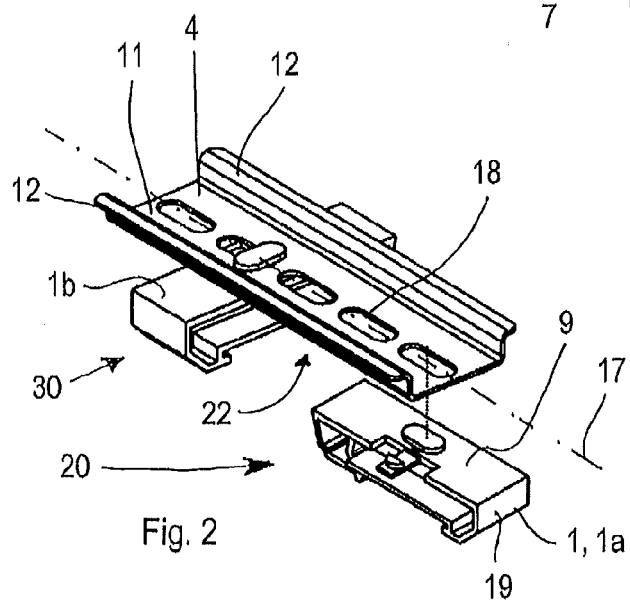
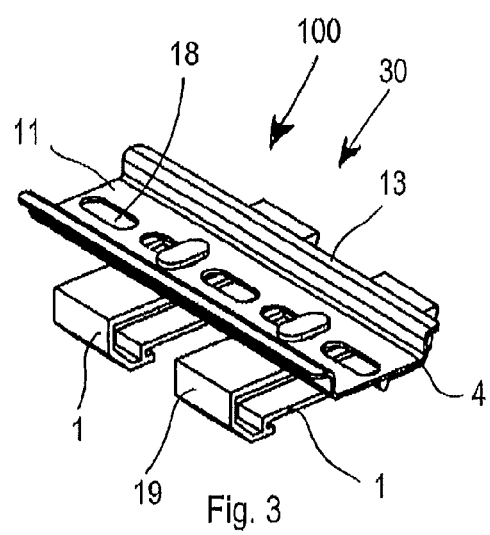
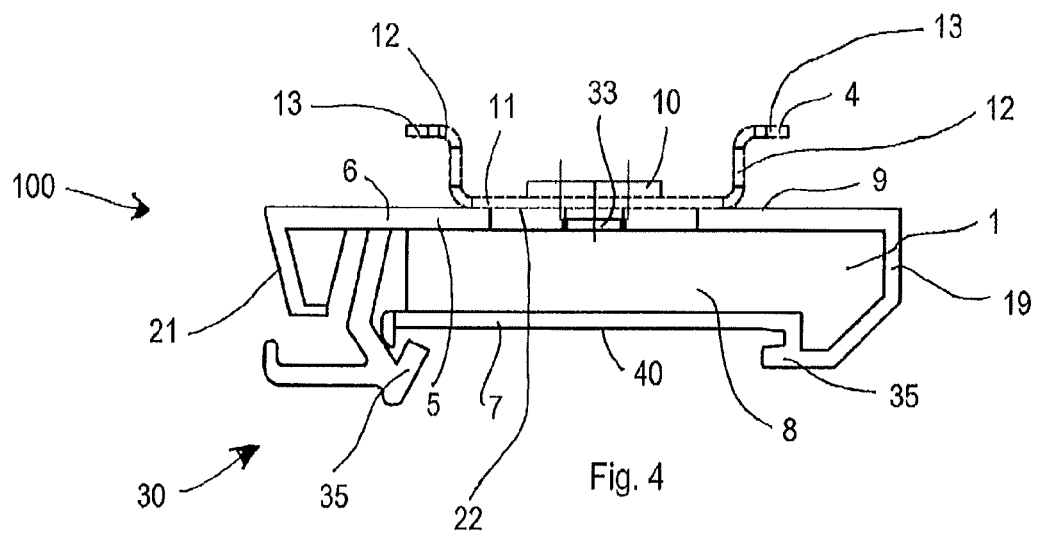

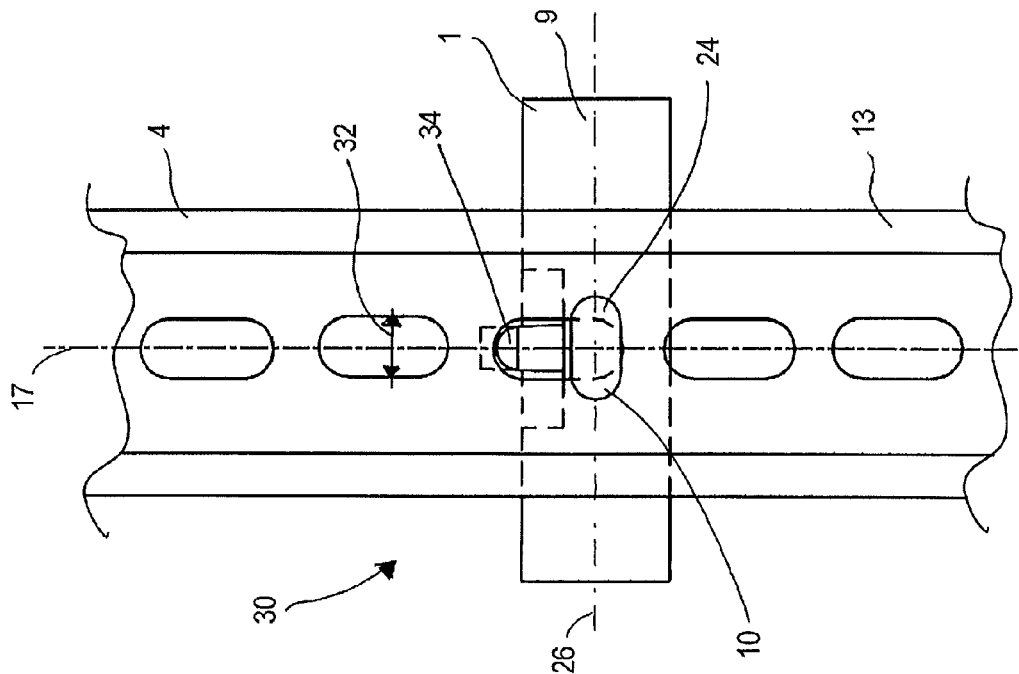
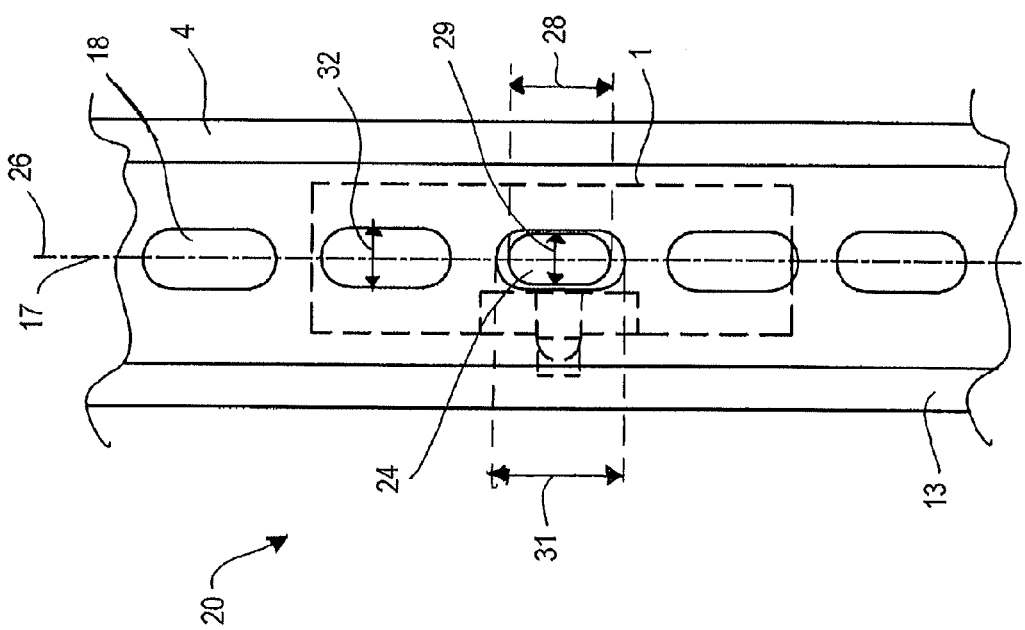

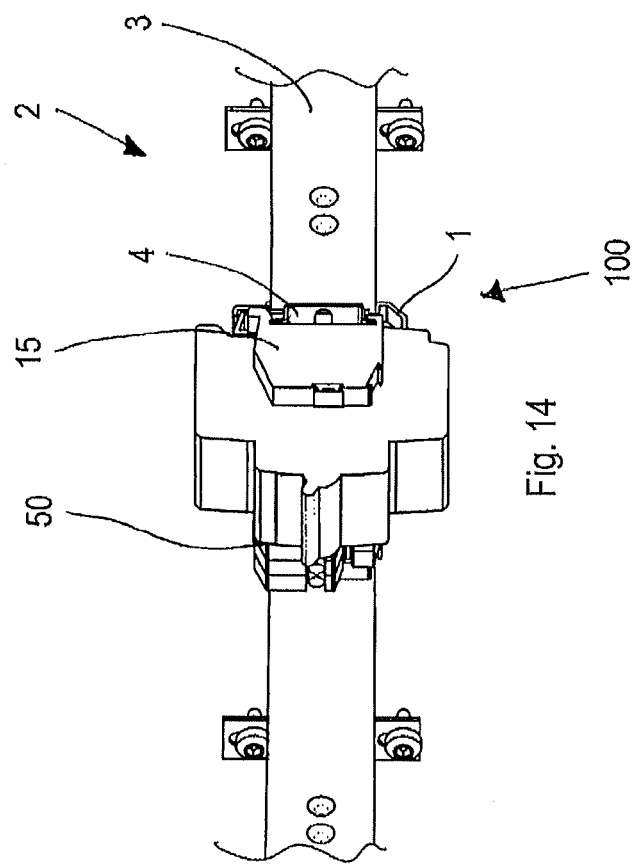
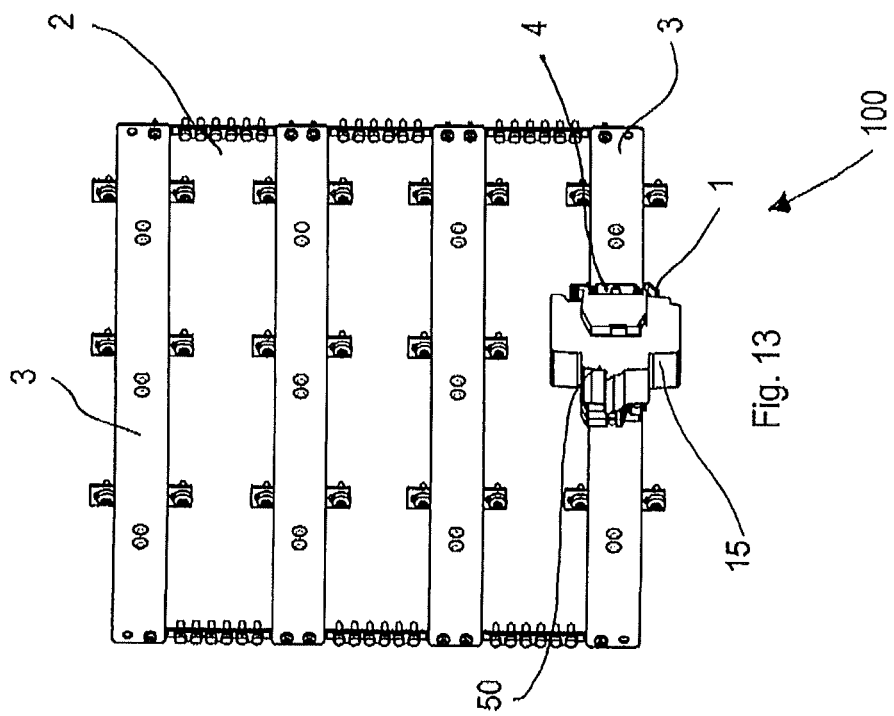

CLAMPING ELEMENT

RELATED APPLICATIONS

This application claims priority as a continuation application under 35 U.S.C. §120 to PCT/EP2012/061598, which was filed as an International Application on Jun. 18, 2012 designating the U.S., and which claims priority to European Application 11175805.8 filed in Europe on Jul. 28, 2011. The entire contents of these applications are hereby incorporated by reference in their entireties.

FIELD

The present disclosure relates to a clamping element configured for easy and quick connection of electrical or electronic devices to a cabinet frame, for example, within a low voltage compartment of a medium voltage switchgear. As used herein, the term medium voltage refers to applications in the range from 1 kV up to some tens of kV, e.g. 36 kV.

BACKGROUND INFORMATION

In the electrical distribution field, a great number of electrical or electronic devices are mounted within a switchgear cabinet, the electrical or electronic devices including for example miniature circuit breakers, residual current circuit breakers, lamps, bell transformers, timer and push buttons etc. Each of such devices includes a mounting face which is so shaped as to match with an elongated bearing rail, for example, a so-called DIN rail which has a Ω-shaped cross-section. The DIN rail is fixed by screw or nuts to a supporting portion of a cabinet frame of a switchgear. The DIN rail has oppositely-disposed side walls provided, at both free edges thereof, with outwardly extending flanges. On the mounting face of each electrical or electronic device there is obtained a U-shaped recess having, on one boundary edge thereof, an inwardly turned lip and, on the opposite boundary edge, an inwardly protruding catch urged by a spring towards the inwardly turned lip. When a device has to be mounted on the DIN rail, the inwardly turned lip is put to engage behind one outwardly extending flange, and the spring-loaded catch makes a snap fit behind the other outwardly extending flange of the DIN rail. Subsequently, the electrical terminals of such a device have to be joined one by one directly to an elongated busbar extending alongside the DIN rail. These mounting and connecting operations are rather wearisome and time-consuming because have to be repeated several times, i.e. have to be performed for each of the above mentioned electrical/electronic devices. Furthermore, if it occurs that all these devices have to be moved to a new location within the cabinet, each of them has first to be electrically disconnected and then mechanically decoupled from the DIN rail. Subsequently, the screws or nuts, which previously might be covered by the electrical devices, must be unscrewed thus enabling the DIN rail to be removed and be fixed to the new desired location within the cabinet. The electrical devices can thus be remounted on the DIN rail in the new location.

It would be desirable to overcome all the above mentioned drawbacks, by providing a clamping element which is simple and cheap to manufacture, and which enables a plurality of electrical/electronic devices to be quickly and easily connected within a switchgear cabinet in a versatile way.

SUMMARY

An exemplary embodiment of the present disclosure provides a clamping element configured for mounting a rail element bearing electrical/electronic devices on a supporting portion of a switchgear cabinet. The exemplary clamping element includes a body having a coupling portion configured for engaging with an opening portion of the rail element. The coupling portion is configured for enabling the body to be at least one of coupled with and removed from the rail element when the body is positioned in a first configuration relative to the rail element. In addition, the coupling portion is configured for hindering removal of the body from the rail element when the body is positioned in a second configuration relative to the rail element. The exemplary clamping element also includes clasping means protruding from the body and configured for removably connecting the body onto the supporting portion to mount the rail element within the switchgear cabinet.

BRIEF DESCRIPTION OF THE DRAWINGS

Additional refinements, advantages and features of the present disclosure are described in more detail below with reference to exemplary embodiments illustrated in the drawings, in which:

FIG. 1 is a perspective view of a clamping element according to an exemplary embodiment of the present disclosure;

FIG. 2 shows a bearing rail and two clamping elements, where one of the clamping elements is lockedly coupled with the bearing rail in a first relative position, and the other clamping element is in a second relative position enabling coupling with and removal from the elongated bearing rail, according to an exemplary embodiment of the present disclosure;

FIG. 3 shows a bearing rail and two clamping elements mutually arranged in an assembled configuration, according to an exemplary embodiment of the present disclosure;

FIG. 4 is a cross-section view showing a clamping element connected to the bearing rail, according to an exemplary embodiment of the present disclosure;

FIG. 9 shows the clamping element in a first configuration enabling coupling with and/or removal from a rail element, according to an exemplary embodiment of the present disclosure;

FIG. 10 shows the clamping element in a second configuration in which it is coupled with the rail element, the second configuration preventing removal of the clamping element from the rail element, according to an exemplary embodiment of the present disclosure;

FIGS. 13 and 15 are a perspective front view and a perspective rear view, respectively showing the assembly of FIG. 11 or 12 which is snap-fitted on a supporting portion of a cabinet;

FIGS. 14 and 16 are enlarged views of FIG. 13 and FIG. 15, respectively, in which the assembly connected to the supporting portion is better shown.

DETAILED DESCRIPTION

Figure 5:
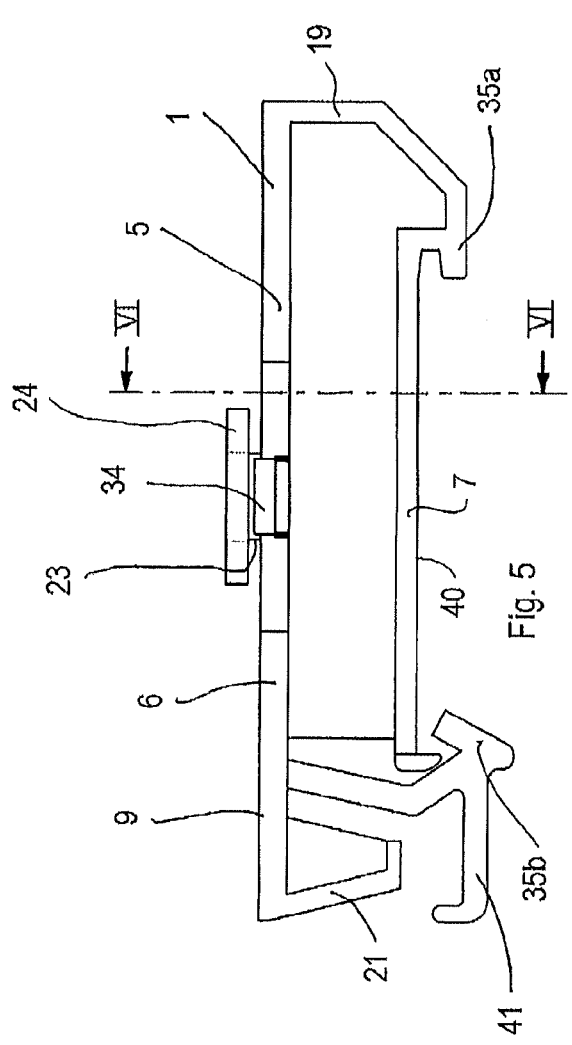
FIG. 5 is a side view of the clamping element according to an exemplary embodiment of the present disclosure.
Figure 6:
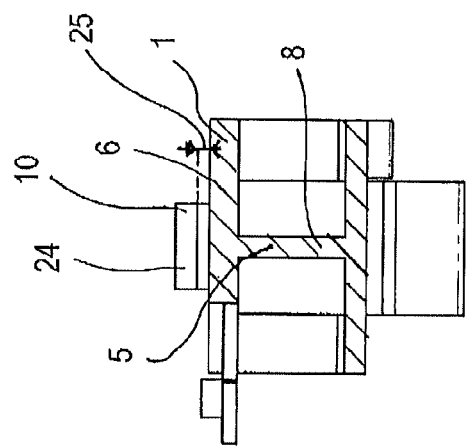
FIG. 6 is a cross-section view of the clamping element taken along the plane VI-VI in FIG. 5.

Exemplary embodiments of the present disclosure provide a clamping element which is simple and cheap to manufacture, and which enables a plurality of electrical/electronic devices to be quickly and easily connected within a switchgear cabinet in a versatile way.

The present disclosure also provides a clamping assembly including one or more clamping elements, and a rail element on which an electrical/electronic-devices-pack can be snap-fitted, as described hereinafter. Furthermore, the present disclosure also provides an electrical switchgear apparatus, where such a term refers to a panel or a cabinet or a switchboard, including one or more of the electrical/electronic-devices-packs and at least one clamping assembly for quick and easy mounting of the packs within such an apparatus.

With reference to the attached drawings, a clamping element 1 and a relative clamping assembly 100 are provided for easy and quick connection of electrical or electronic devices to a cabinet frame 2 of a medium voltage switchgear. The electrical or electronic devices may include, for example, miniature circuit breakers, residual current circuit breakers, lamps, bell transformers, timer and push buttons, feed-through terminal blocks, double deck or triple deck terminal blocks, fuse devices, sensor devices etc.

The clamping element 1, for example, enables the connection of such electrical/electronic devices, through a rail element 4, to a supporting bracket 3 of the cabinet within a low voltage compartment of the switchgear. For example, the rail element may include a standardized so called "DIN rail" 4. The DIN rail 4, with an elongated shape, has a desired length according to specific requirements. The DIN rail 4 has a base wall 11 extending so as to define a first longitudinal axis 17 along which a plurality of openings 18 is distributed whose function is to mechanically couple with respective clamping elements 1 as it will be described in detail later on.

The openings 18 have an elongated shape along the longitudinal axis 17 and, in a non-limitative way, a rounded rectangular shape.

From the base wall 11 of the DIN rail 4, two oppositely-disposed side walls 12 protrude. At each free edge of the side walls 12 there is provided an outwardly extending flange 13 whose function is to engage with a mounting face of an electrical/electronic device 15, the mounting face including a snap-fitting recess 14. Specifically, the snap-fitting recess 14 of each electrical/electronic device 15 has boundary edges on which there are provided opposite inwardly turned lips 16 which are shaped for engaging with the respective outwardly extending flanges 13 of the DIN rail 4.

One or both the turned lips 16 can be elastically flexible for enabling the clamping element 1 to be snap-fitted on the DIN rail 4. In a possible version, one of the turned lips 16 is catch-urged towards the other lip by a spring that can be compressed for enabling engagement of the lips 16 with the flanges 13 of the DIN rail 4.

The clamping element 1, as better shown in FIGS. 1 and 4-8, includes a body 5 including a first wall 6, configured for going in contact with the DIN rail 4, and a second wall 7 configured for receiving a mounting face of an electrical/electronic device. The first wall 6 and the second wall 7 have a plane shape and are parallel and spaced apart from one other. A third wall 8, acting as a spacer portion, is interposed between the first wall 6 and the second wall 7. The third wall 8 is orthogonally arranged with respect to the first wall 6 and the second wall 7 and acts as reinforcing zone of the body 5.

A first abutting surface 9 is defined on the first wall 5 which is configured for being applied to a resting surface 22 of the DIN rail 4.

A second abutting surface 40 externally provided on the second wall 7 is intended to rest against the supporting bracket 3 of the cabinet.

The first wall 6 is delimited at a first end by an orthogonally protruding first end wall 19, and at a second end by a transversely arranged second end wall 21. Both the first end wall 19 and the second end wall 21 project from the first wall 6 at a side opposite with respect to the first abutting surface 9.

A coupling portion 10 is integrally obtained on the first abutting surface 9, the coupling portion 10 being configured for engaging with a respective opening 18 of the DIN rail 4. The coupling portion 10, as better described in the following, is configured for enabling the body 5 to be coupled with, or removed from the DIN rail 4 when the body 5 is positioned in a first configuration 20 relative to the DIN rail 4, and for hindering removal of the body 5 from the DIN rail 4 when the body 5 is positioned in a second configuration 30 relative to the rail element 4, as it will be described in detail later on.

The first configuration 20 and the second configuration 30 can be seen in FIGS. 2, 3, 9 and 10. FIG. 2 shows a clamping element 1a in which the first end wall 19 results substantially orthogonally arranged with respect to the first longitudinal axis 17, with the first abutting surface 9 facing the resting surface 22 of the DIN rail 4. The clamping element 1a so arranged can be coupled with the DIN rail 4.

In the second configuration 30, as shown in FIG. 3 or 10, or in FIG. 2 (see the clamping element 1b), the clamping element is rotated by 90° with respect to first configuration 20, as better described later on.

The coupling portion 10 includes a stem portion 23 protruding transversely, preferably substantially orthogonally, from the first abutting surface 9 and a head portion 24 which extends transversely from the stem portion 23 and substantially parallel to the first abutting surface 9. The head portion 24 has an extension greater than a cross section of the stem portion 23. This enables the coupling portion 10 to firmly engage with a zone surrounding the opening 18. For example the head portion 24, in a non-limitative way, has an elongated and rounded rectangular shape, similar to the shape of the openings 18. The head portion 24 longitudinally extends so as to define a second longitudinal axis 26 parallelly arranged with respect to longer edges 27 of the body 5, i.e. orthogonally arranged to the first end wall 19. The head portion 24 has a length dimension 28 and a width dimension 29 which is smaller than the length dimension 28. The length dimension 28 is so chosen as to be substantially equal or less than a further length dimension 31 of the opening 18 and greater than a further width dimension 32 of the opening portion, whereas the width dimension 29 is so chosen as to be substantially equal or less than the further width dimension 32. These dimensions enable the head portion 24 to enter the opening 18 in the first configuration 20 and to prevent the head portion 24, in the second configuration 30, from disengaging from the opening 18.

Figure 7:
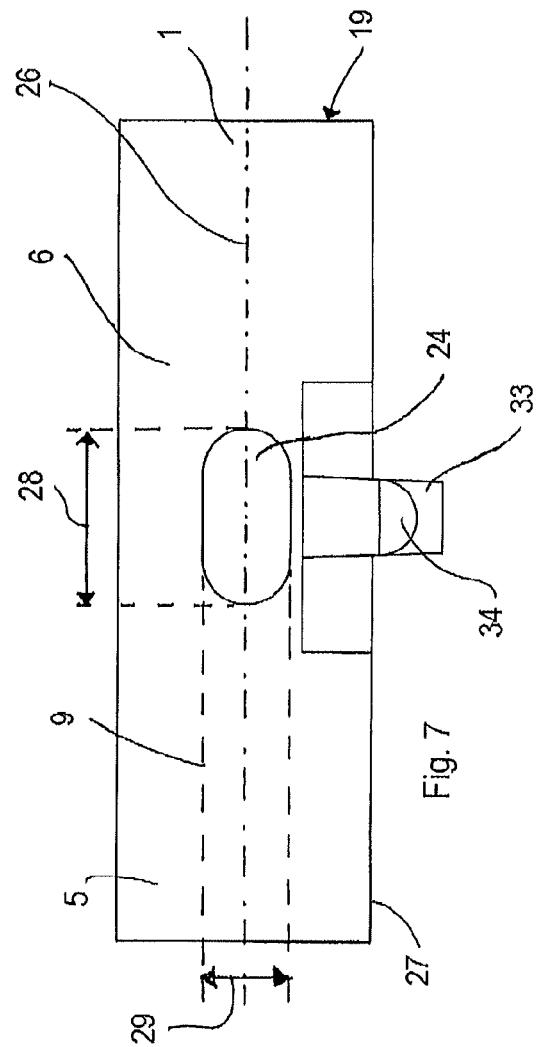
FIG. 7 is a top view of the clamping element in FIG. 5.
Figure 8:
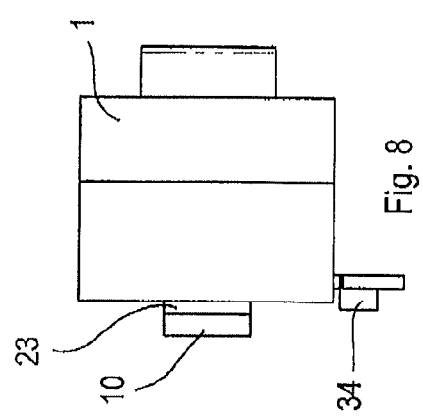
FIG. 8 is a side view of the clamping element in FIG. 7.
Figure 11:
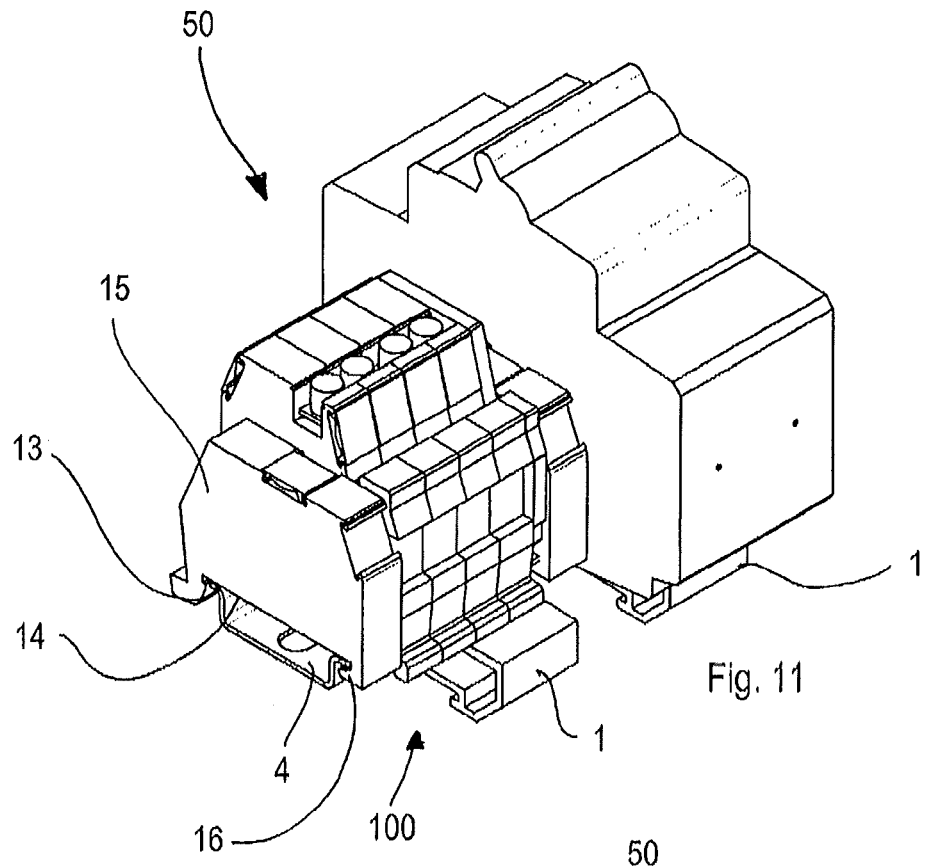
FIG. 11 is a perspective view of an assembly including two clamping elements of the disclosure which are coupled with a bearing rail, the bearing rail supporting a pack of several grouped electrical/electronic devices, according to an exemplary embodiment of the present disclosure.
Figure 12:
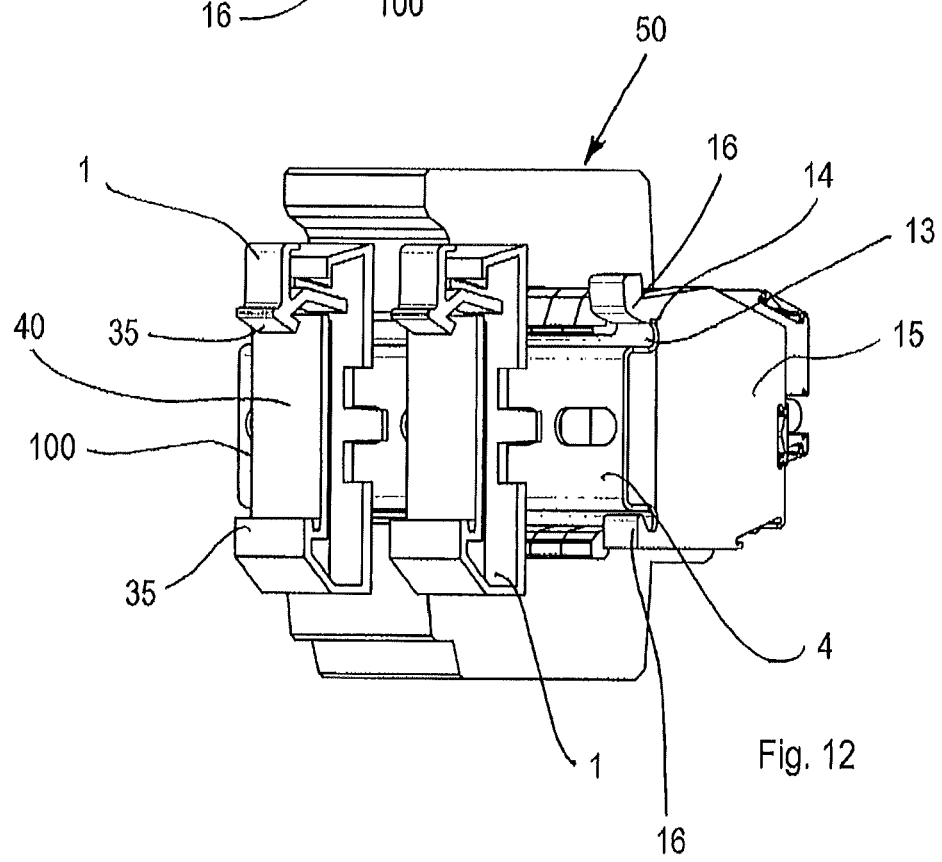
FIG. 12 is a further perspective view of the assembly in FIG. 11.
Figure 16:
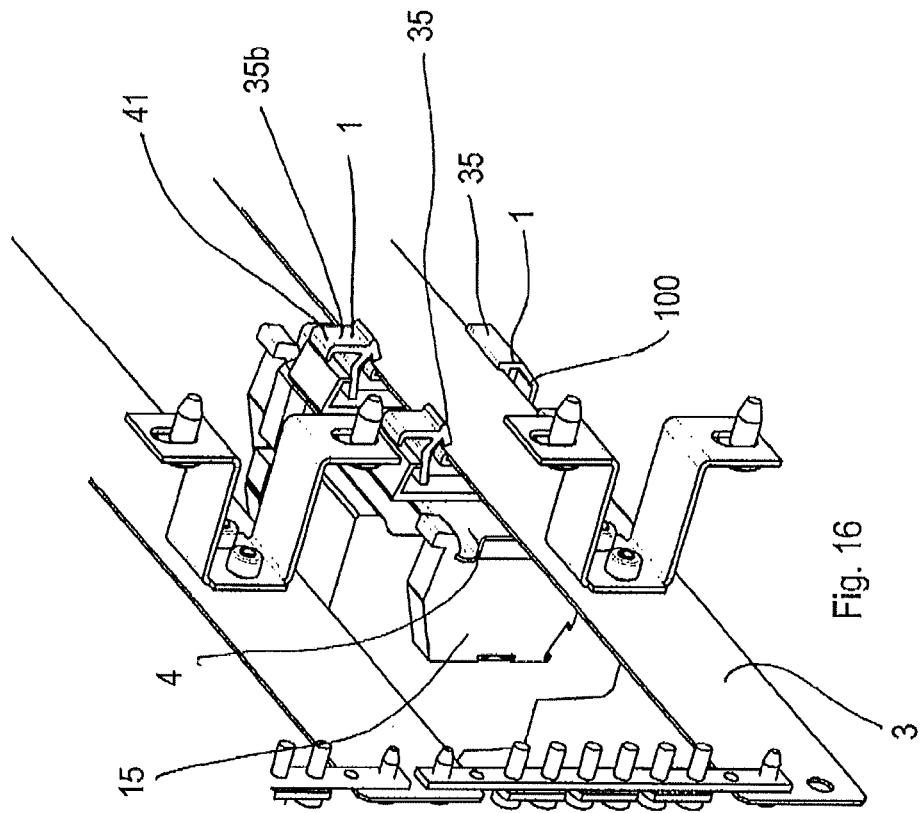
Figure 15:
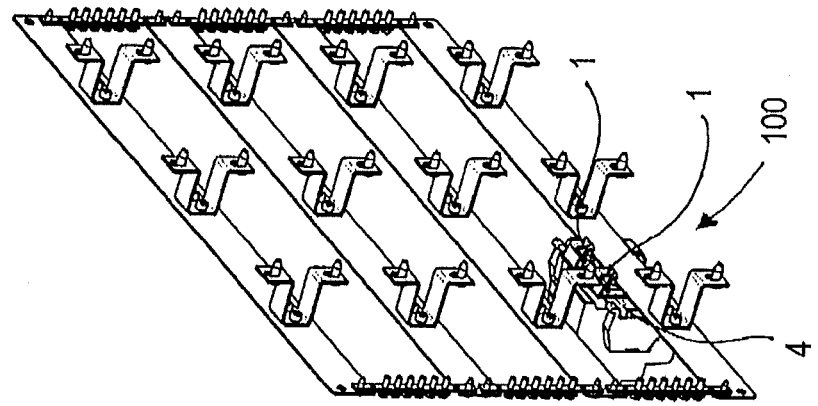

The clamping element 1 is provided with locking means 33, better shown in FIG. 7, integral with the body 5 and configured for locking the clamping element 1 in the second configuration 30 thus preventing disengagement from the DIN rail 4.

For example, the locking means includes a locking protrusion 33 which is shaped for engaging with a respective opening 18 in the second configuration 30. The locking protrusion 33 extends in a cantilever way from the first plane wall 6 of the body 5, along an orthogonal direction with respect to the second longitudinal axis 26. The locking protrusion 33 includes a bulge end 34 which, in the second configuration 30, is housed in, and engages with a respective opening 18 for preventing a rotation of the clamping element 1 relative to the DIN rail 4 and thus removal therefrom.

The locking protrusion 33 is configured so that it can be elastically flexed upon a pushing action for disengaging the bulge end 34 from the respective opening 18 thus enabling rotation of the clamping element 1 and removal from the DIN rail 4.

The head portion 24 is spaced apart from the first abutting surface 9 by a distance 25 (see FIG. 6) which is about equal or slightly greater than the thickness of the DIN rail 4, so as to take up slack of the clamping element 1 in an orthogonal direction to the resting surface 22. Owing to the shape of the coupling portion 10 and to the looking protrusion 33, a firm connection of the clamping element 1 to the DIN rail 4, in the second configuration 30, is ensured.

In the following, it is described how to mechanically associate a clamping element 1 to the DIN rail 4.

First, the clamping element 1 has to be positioned in the first configuration 20, i.e. it has to be orientated with the second longitudinal axis 26 of the coupling portion 10 parallel to the first longitudinal axis 17 of the DIN rail 4 and the head portion 24 positioned for being inserted in the corresponding opening 18, as shown in FIG. 9 or 2. The clamping element 1 is applied on the receiving surface 22 while the coupling portion 10 is inserted in the opening 18 thus projecting the head portion 24 beyond the opening 18 on the side opposite the receiving surface 22. During this phase, the bulge end 34 is kept pressed against the resting surface 22 of the DIN rail 4 thus flexing the locking protrusion 33. Once the head portion 24 is come out of the opening 18, the clamping element 1 can be rotated by an angle of 90° in the second configuration 30, as shown in FIG. 10 so that the head portion 24 is transversely arranged with respect the opening 18 thus facing, or even going into contact with, neighbouring zones of the opening 18. In the meantime the bulge end 34 is brought in the opening 18. When the pressing action of the receiving surface 22 on the bulge end 34 is over at the end of the abovementioned rotation, the locking protrusion 33 is released from the flexure status and the bulge end 34 is housed in the opening 18. The bulge end 34 cooperating with the opening 18 prevents a rotation of the clamping element 1 relative to the DIN rail 4, whereas the head portion 24 prevents any movement of the clamping element 1 orthogonally to the resting surface 22. The hooking protrusion may also have a length dimension in such a way to prevent also any displacement of clamping element along the first longitudinal axis 17.

The clamping element 1 includes clasping means 35, better shown in FIGS. 4, 5, 12, and 16, protruding from the body 5 and configured for removably connecting the clamping element 1 to the supporting bracket 3 (better shown in FIG. 16) of the cabinet. The DIN rail 4, bearing one or more electrical/electronic devices, can be coupled to one or more clamping elements 1 and the latter, owing to the clasping means 35, can be clasped to the supporting bracket 3 in a desired location. Advantageously, owing to the clasping means 35 integrally provided on the clamping element 1, there is no need for inconvenient and time consuming screws or nuts or further auxiliary fixing devices for mounting the DIN rail 4 on the supporting bracket 3.

The clasping means 35 may, for example, include a pair of hooking protrusions 35 which project near the second wall 7 at the opposite side with respect to the coupling portion 10.

The hooking protrusion 35 are inwardly turned near the second abutting surface 40 of the second wall 7. For example, with reference to FIG. 5, a first hooking protrusion 35a is integrally obtained on the first end wall 19 of the clamping element 1, and a second opposite hooking protrusion 35b projects directly from an internal surface of the first plane wall 6. The second hooking protrusion 35b is arranged in a cantilever way thus resulting elastically flexible in order to enable engagement with, and disengagement from the supporting portion 3. For example the second hooking protrusion 35b is provided with a lever portion 41 which can be pushed towards the first plane wall 6 in order to facilitate a flexure of the hooking protrusion 35b thus enabling removal of the clamping element 1 from the supporting bracket 3.

The hooking protrusions 35 together with the second abutting surface 40 define on the body 5 a mounting recess configured for embracing the supporting bracket 3 for the snap-fitting of the clamping element 1 on the cabinet.

During functioning, one or more clamping elements 1, which have been preliminarily associated to a DIN rail 4 with the procedure above discussed, can be easily and rapidly clasped to the supporting bracket 3 through the clasping means 35 with no use of auxiliary fixing elements such as nuts or screws. Coupling of the clamping elements 1 with the supporting bracket 3 can be facilitated by acting on the lever portion/s 41 associated with the clasping protrusion/s 35b above described.

For removing the clamping elements 1 from the supporting bracket 3 it is sufficient to push the lever portions 41 and move away the clamping elements 1 from the supporting portion 3. The so removed group, defined by the clamping elements 1 and the DIN rail 4 bearing any electrical/electronic devices 15, as shown in FIGS. 11 to 16, can be easily and rapidly placed in a new different location within the cabinet, for example on a different portion of the supporting bracket 3.

One or more clamping elements 1, together with a rail element, such as a DIN rail 4, therefore define a versatile clamping assembly 100 which enables an easy and quick connection of electrical/electronic devices in the cabinet and makes possible to exploit in an optimized manner the room within the cabinet.

Owing to the clamping elements 1, it is possible to prepare one or more packs 50 of mutually grouped electrical/electronic devices 15 which are preliminarily snap-fitted on a DIN rail 4 of desired length, ready to be mounted within a switchgear cabinet. The electrical or electronic devices defining the pack 50 may include, for example, miniature circuit breakers, residual current circuit breakers, lamps, bell transformers, timer and push buttons, feed-through terminal blocks, double deck or triple deck terminal blocks, fuse devices, sensor devices, etc.

In this way, the mounting operations are considerably simplified and accelerated with respect to the prior art solutions which require the repetitive and time-consuming mounting of the electrical devices one by one and the inconvenient and wearisome use of screws or nuts for fixing the DIN rail to the cabinet.

According to an exemplary embodiment, a plug-socket connector for the simultaneous electrical connection of all the devices 15 defining the pack 50 can be envisaged, thus furthermore simplifying and speeding up the mounting operations.

The clamping element 1 according to the present disclosure fully achieves the intended aims of providing a technical solution for the quick, easy, cheap and versatile connection of electrical/electronic in a cabinet.

The clamping element 1 is susceptible of modifications or variations all within the scope of the inventive concept, and any details may be replaced with technically equivalent elements.

For example, the shape, position and dimensions of the coupling portion 10 and/or of the locking protrusion 33 can also be configured differently from what above described, according to specific needs or particular geometrical configurations of the rail elements, or DIN rails. For example, if differently shaped or orientated openings 18 of the DIN rail 4 have to be used, a different and adequate shape and orientation of the coupling portion 10 can be envisaged for the clamping element 1. Also the dimensions and shape of the clasping means 35 can be adapted to specific requirements of a switchgear cabinet. The clamping element 1 can be made of a plastics material thus resulting light and cheap to be manufactured. However the clamping element 1 can be made from other suitable materials as well.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A clamping element configured for mounting a rail element bearing electrical/electronic devices on a supporting portion of a switchgear cabinet, the clamping element comprising:
   a body including a coupling portion configured for engaging with an opening portion of the rail element, the coupling portion being configured for enabling the body to be at least one of coupled with and removed from the rail element when the body is positioned in a first configuration relative to the rail element, the coupling portion being configured for hindering removal of the body from the rail element when the body is positioned in a second configuration relative to the rail element;
   clasping means protruding from the body and configured for removably connecting the body onto the supporting portion to mount the rail element within the switchgear cabinet; and
   locking means integral with the body and configured for locking the clamping element in the second configuration to prevent disengagement from the rail element, wherein the locking means includes a locking protrusion that is shaped for engaging with the opening portion of said rail element in the second configuration.

2. The clamping element according to claim 1, wherein the body comprises a first abutting surface configured for abutting on a resting surface of the rail element, and
   wherein the coupling portion comprises a stem portion protruding transversely from the first abutting surface and a head portion which extends transversely from the stem portion and substantially parallel to the first abutting surface.

3. The clamping element according to claim 2, wherein the head portion is at a distance from the first abutting surface which is about equal to a thickness of the rail element.

4. The clamping element according to claim 2, wherein the head portion has an enlarged shape with respect to a cross section of the stem portion, the enlarged shape allowing insertion of the coupling portion into the opening portion in the first configuration, and hindering extraction of the coupling portion from the opening portion when the body is in the second configuration.

5. The clamping element according to claim 4, wherein the head portion has an oblong shape having a length dimension and a width dimension which is smaller than the length dimension.

6. The clamping element according to claim 5, wherein the length dimension is substantially equal to or less than a further length dimension of the opening portion and greater than a further width dimension of the opening portion, and
   wherein the width dimension of the oblong shape is substantially equal or less than the further width dimension.

7. The clamping element according to claim 4, wherein the head portion extends along a longitudinal axis to be arranged transversely to a further longitudinal axis of the rail element when the body is in the second configuration.

8. The clamping element according to claim 1, wherein the locking protrusion is provided with a bulge end which is shaped for engaging with the opening portion when the body is coupled with the rail element in the second configuration, the locking protrusion being elastically flexible upon a pushing action in order to disengage the bulge end from the opening portion.

9. The clamping element according to claim 1, wherein the clasping means comprise a pair of hooking protrusions integrally obtained on the body and provided on an opposite side with respect to the coupling portion.

10. The clamping element according to claim 9, wherein the hooking protrusions are inwardly turned near a further abutting surface of the body which is configured to rest on the supporting portion, the hooking protrusions and the further abutting surface cooperating together for defining a mounting recess configured for removably embracing the supporting portion.

11. The clamping element according to claim 10, wherein one of the hooking protrusions is elastically flexible for allowing snap-fitting of the body on the supporting portion and is provided with a lever portion which is pushable to facilitate a flexure of the hooking protrusion for enabling removal of the clamping element from the supporting portion.

12. The clamping element according to claim 10, wherein the abutting surface and the further abutting surface are provided on a first wall and a second wall of the body, respectively, the first wall and the second wall being parallel to and spaced apart from one other, a third wall being orthogonally interposed between the first wall and the second wall.

13. A clamping assembly comprising:
   at least one clamping element according to the clamping element of claim 1; and
   a rail element configured for bearing a plurality of electrical/electronic devices on the rail element through a plurality of distributed opening portions each opening portion being configured for engaging with a coupling portion of a respective one of the at least one clamping element.

14. A kit comprising:
   a pack of mutually grouped electrical/electronic devices which is configured to be mounted within a switchgear apparatus;
   a rail element on which the pack is snap-fittable; and
   at least one clamping element according to the clamping element of claim 1, the at least one clamping element being configured for connecting the rail element bearing the pack to a supporting portion of a switchgear cabinet.

15. A switchgear cabinet comprising:
   a supporting portion;
   at least one clamping element according to the clamping element of claim 1; and
   a rail element bearing one or more electrical/electronic devices.

* * * * *